United States Patent [19]

D'Anna et al.

[11] Patent Number: 4,971,929

[45] Date of Patent: Nov. 20, 1990

[54] METHOD OF MAKING RF TRANSISTOR EMPLOYING DUAL METALLIZATION WITH SELF-ALIGNED FIRST METAL

[75] Inventors: Pablo E. D'Anna, Los Altos; Howard D. Bartlow, Sunnyvale, both of Calif.

[73] Assignee: Microwave Modules & Devices, Inc., Mountain View, Calif.

[21] Appl. No.: 213,997

[22] Filed: Jun. 30, 1988

[51] Int. Cl.⁵ .......................................... H01L 21/443
[52] U.S. Cl. ..................... 437/192; 437/31; 437/32; 437/917; 148/DIG. 11
[58] Field of Search ............... 437/192, 193, 74, 31, 437/32, 917; 118/728; 148/DIG. 11

[56] References Cited

U.S. PATENT DOCUMENTS

| | | | |
|---|---|---|---|
| 4,281,448 | 8/1981 | Barry et al. | 437/84 |
| 4,398,335 | 8/1983 | Lehrer | 437/192 |
| 4,575,920 | 3/1986 | Tsunashima | 437/192 |
| 4,616,401 | 10/1986 | Takeuchi | 437/192 |
| 4,648,909 | 3/1987 | Krishna et al. | 437/31 |
| 4,796,562 | 1/1989 | Brors et al. | 118/728 |
| 4,806,499 | 2/1989 | Shinohara | 437/31 |
| 4,824,799 | 4/1989 | Komatsu | 437/31 |
| 4,910,170 | 3/1990 | Motozima et al. | 437/31 |

OTHER PUBLICATIONS

Georgiou et al., "Tungsten and Other Refractory Metals for VLSI Application II", 1987, Materials Research Society, pp. 227-234.
Broadbent et al., "Selective Tungsten Processing by Low Pressure CVD", Solid State Technology, 1985; pp. 51-59.
Wolf et al., "Silicon Processing for the VLSI Era", vol. 1: Process Technology, 1986; pp. 384-405.
Miller et al., "CVD Tungsten Interconnect and Contact Barrier Technology for VLSI"; Solid State Technology 1982; pp. 85-90.
Calsson et al; "Thermodynamic Investigation of Selective Tungsten CVD"; Thin Solid Films, vol. 158, 1988 pp. 107-122.
Green et al; "Structure of Selective Low Pressure Chemically Vapor-Deposited Films of Tungsten"; J. Electrochem. Soc. vol. 132, No. 5, pp. 1243-1249.

*Primary Examiner*—Brian E. Hearn
*Assistant Examiner*—Trung Dang
*Attorney, Agent, or Firm*—Henry K. Woodward

[57] ABSTRACT

An improved dual metallization process in which self-aligned tungsten contacts are formed to closely-spaced emitter or source sites in RF power silicon devices. Low-resistivity ohmic contacts are made by selectively depositing tungsten on the exposed silicon surfaces as a first metal layer without a photomasking process and after a dielectric layer deposition and via opening process. The metallization process is completed by depositing a second metal or polysilicon layer on the dielectric layer and through vias to selected tungsten contacts. The tungsten combines with doped silicon in the emitter or source regions to form the low-resistivity ohmic contacts without the requirement of a platinum or palladium deposition and siliciding step as in prior art. The tungsten is preferably chemical-vapor-deposited in a two-temperature step when a first few hundred Angstroms of tungsten are grown at a low temperature on the order of 250° C.-350° C. to avoid metal encroaching into the side of the shallow emitter or source diffusions and shorting the device. After a few hundred Angstroms of slow tungsten growth, the temperature may be raised up to the order of 400°C.-650° C. to increase the deposition rate of the tungsten.

8 Claims, 5 Drawing Sheets

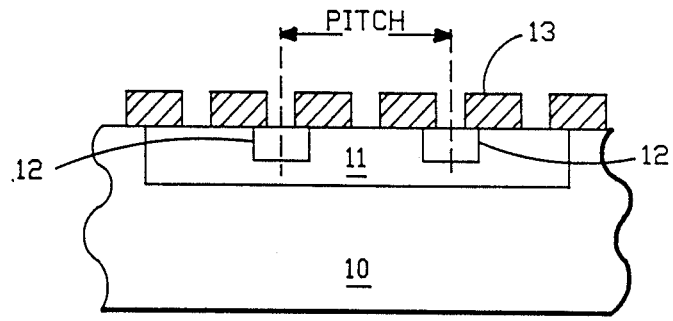
( SILICON BIPOLAR DEVICE )
FIG.—1A
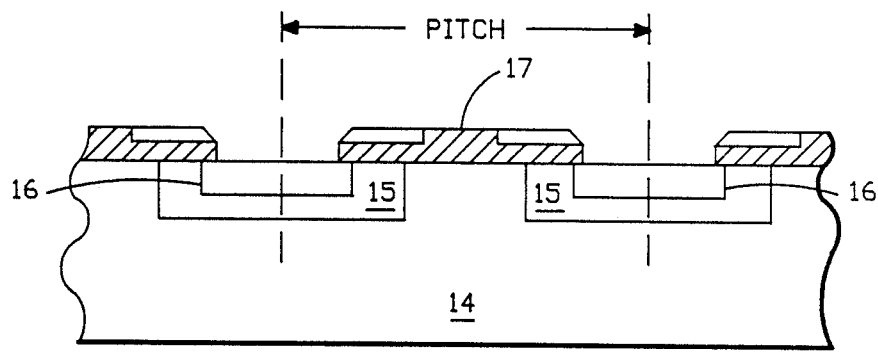
( SILICON DMOS DEVICE )
FIG.—1B
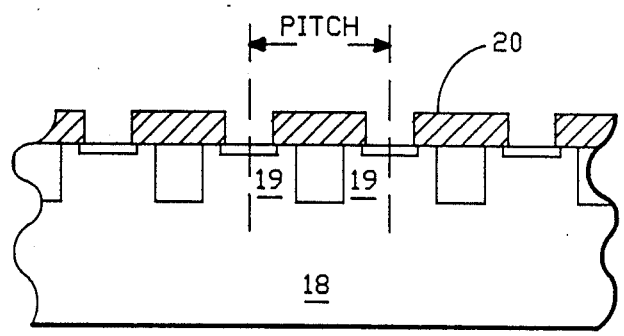
( SILICON STATIC INDUCTION TRANSISTER )
FIG.—1C

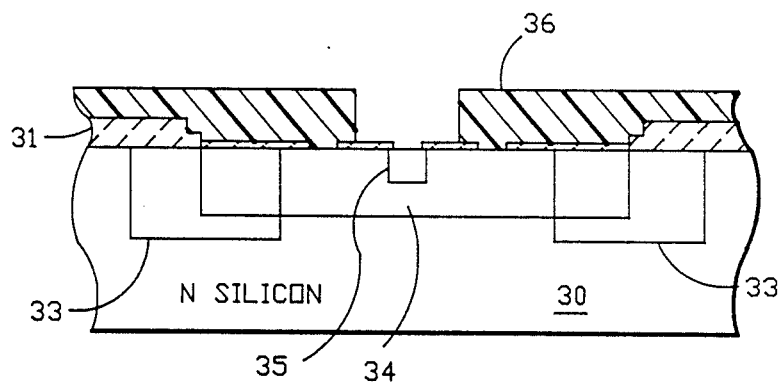
FIG.−5
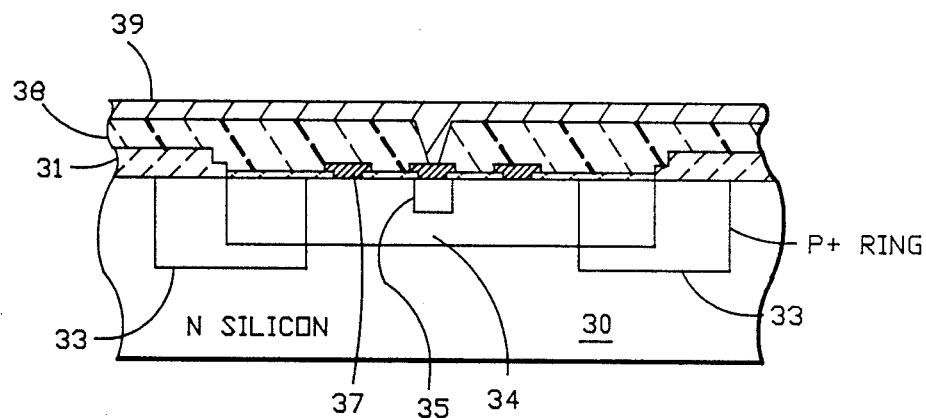
FIG.−6
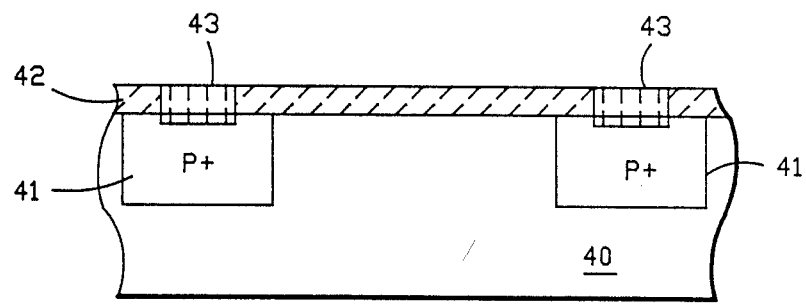
FIG.−7

METHOD OF MAKING RF TRANSISTOR EMPLOYING DUAL METALLIZATION WITH SELF-ALIGNED FIRST METAL

BACKGROUND OF THE INVENTION

This invention relates generally to semiconductor devices such as RF transistors, and more particularly the invention relates to RF transistors and integrated circuits employing dual metallization (including polysilicon) with a self-aligned first metal layer.

High-power, high-frequency silicon transistors have low pitch or closely-spaced emitter or source sites. As the device pitch or distance between emitter or source sites is reduced, single-layer metallization becomes difficult to employ in device fabrication. Accordingly, a number of dual-metallization schemes has been proposed to relieve the fabrication constraints as well as improve reliability encountered by the single-layer metal system. However, these dual-layer metal systems for high-power, high-frequency devices utilize conventional techniques that require a mask alignment and photoresist patterning of the first and second metal layers with associate problems of image positioning, photoresist development, accuracy of image transfer, and etch. Thus, there exists a need for providing a method of processing dual-layer metal RF power silicon device structures to overcome the problems attendant with prior-art devices and techniques.

SUMMARY OF THE INVENTION

An object of the invention is an improved semiconductor device such as an RF power transistor utilizing dual metallization.

Another object of the invention is an improved process for depositing and patterning the first metal layer in a dual-layer metallization process for high-power, high-frequency silicon devices.

Yet another object of the invention is to reduce the parasitic base resistance of small-pitch, high-power bipolar devices where connection of all of the base sites is done with a self-aligned metal layer instead of a diffusion layer or heavily-doped polysilicon.

Still another object of the invention is to provide a self-aligned metal pattern for polysilicon gate MOS devices as a means to reduce gate resistance.

Briefly, in fabricating a dual-metal device in accordance with the present invention, contact regions on a silicon structure are exposed through a protective oxide layer, and a layer of tungsten is deposited on the exposed silicon and combined with the exposed silicon to form low-resistivity ohmic contacts. In a preferred embodiment, the tungsten is deposited by chemical vapor deposition in a two-step process where the first few hundred Angstroms of the tungsten are deposited at a low temperature on the order of 250°–350° C. to avoid metal encroaching into the sides of the shallow emitter or source diffusions and shorting the devices. After a few hundred Angstroms of slow deposition, the temperature is raised to a high temperature such as 650° C. and the deposition proceeds at a faster rate to build up a tungsten layer of about the same height as the oxide thickness surrounding the contact region.

Thereafter, a passivation layer is applied over the tungsten metallized contacts and vias are opened to the tungsten metal. A second metallization layer is then deposited by evaporation or sputtering and patterned to complete the structure using conventional techniques.

The invention and objects and features thereof will be more readily apparent from the following detailed description and appended claims when taken with the drawing.

BRIEF DESCRIPTION OF THE DRAWING

FIGS. 1A–1C are section views illustrating pitch in silicon bipolar, DMOS, and static induction transistors.

FIGS. 2–6 are section views illustrating steps in fabricating a silicon bipolar device in accordance with the invention.

FIGS. 7–10 are section views illustrating steps in fabricating a silicon DMOS device in accordance with the invention.

DETAILED DESCRIPTION OF ILLUSTRATIVE EMBODIMENTS

Figure 2:
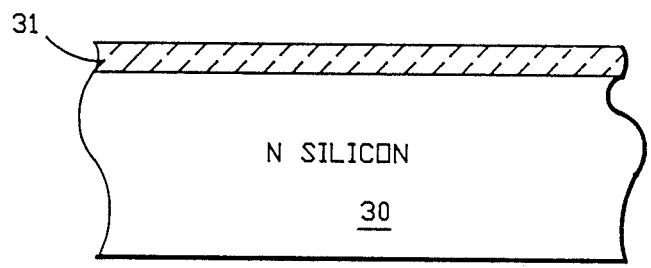

FIGS. 1A–1C are section views illustrating the pitch in a silicon bipolar device, a silicon DMOS device, and a silicon static induction transistor, respectively. In the bipolar device of FIG. 1A, a substrate 10 has a base region 11 formed therein, with dual emitters 12 formed in the base region through the oxide layer 13. Pitch is defined as the distance between the emitters 12.

In FIG. 1B, a DMOS device is fabricated in substrate 14 with doped regions 15 forming the channel regions and the source regions being defined by doped regions 16 defined through oxide layer 17. The distance between the source regions 16 is defined as pitch.

In FIG. 1C, a static induction transistor is formed in substrate 18 with openings provided through oxide layer 20 for source and gate openings as shown at 19. Pitch is defined as the distance between adjacent source regions in the mesas 19.

As above described, single-layer metallization is difficult to fabricate in a low-pitch device. For that reason a number of dual-metallization schemes have been proposed which employ conventional techniques requiring mask alignment and photoresist patterning of the first and second metal layers with associated problems of image positioning, development of the resist, accuracy of image transfer, and etch, or plating-up of metals.

In accordance with the invention, an improved dual-metallization process is provided for low-pitch transistor devices in which the first metal layer is self-aligned without requiring a photomasking process. After the first metal layer is formed, a dielectric layer is deposited and a second metal layer is deposited and patterned using conventional techniques.

Figure 3:
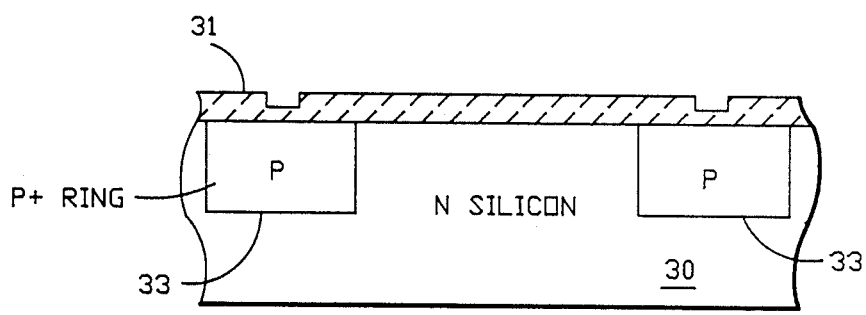
Figure 4:
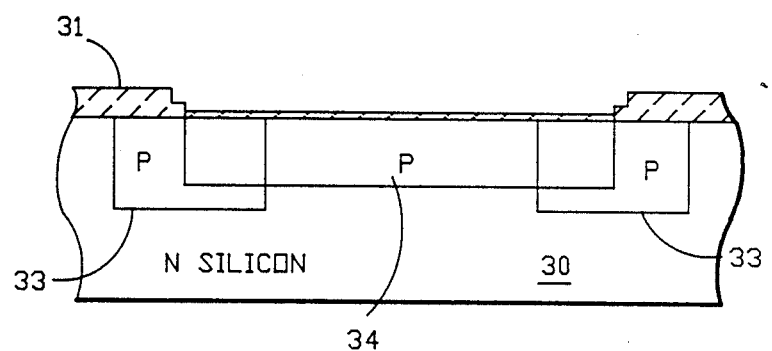

FIGS. 2–6 are section views of a semiconductor structure illustrating the steps in fabricating a silicon bipolar device in accordance with one embodiment of the invention. Referring to FIG. 2, the process starts with an n-type silicon substrate 30 having a protective or passivating silicon oxide layer 31 grown thereon. A standard masking technique is then used to define an opening formed in the oxide layer 31 to expose the silicon surface area into which is diffused or implanted a p-type dopant, for example boron, as illustrated in FIG. 3. Oxide layer 31 must be thick to mask against the p-type diffusion or implant doping step forming the p+ ring 33 used for breakdown enhancement. The p-type dopant is diffused to the desired depth to form a breakdown enhancement deep diffused ring 33. Oxide 31 is regrown in the opening as well as in the field oxide. A second opening is formed inside the ring area and the p-type base 34 is formed by diffusion or implantation of boron to the desired depth as shown in FIG. 4. Oxide is regrown or deposited thereafter. A composite mask with both emitter and base contact openings is etched on the oxide covering the base 34, and arsenic is implanted to form the emitter 35 using an enlarged emitter resist layer 36 as a protective mask as shown in FIG. 5.

After the photoresist is removed and the emitter implant is thermally activated, the device is ready for the CVD deposition of tungsten metal as the first metal layer. This is done in a CVD system as a one- or two-temperature process using $WF_6$ and $H_2$ and sometimes $SiH_4$ as reactant gases. The purpose of this first metal layer is twofold. First, some of the metal combines with the doped silicon in the emitter and base to form low-resistivity ohmic contacts; heretofore this function required an additional platinum or palladium deposition and siliciding step in prior-art realizations. The second purpose of the first layer of tungsten metal is to provide a low-resistivity path to feed current to the base and emitter finger areas. The CVD deposition conditions are set up such that the tungsten metal grows only on top of the silicon exposed areas, thereby eliminating the need for patterning this first layer. A two-temperature step may be used to deposit the tungsten metal, wherein the first few hundred Angstroms are grown at a low temperature of about 250°-350° C. to avoid metal encroaching into the side of the very shallow emitter diffusions and thereby shorting the device. After a few hundred Angstroms of slow, growth, the temperature can be raised to about 450°-650° C. and the process is allowed to proceed faster to build up a tungsten layer 37 of about the same height as the base-oxide thickness (3,000 to 5,000 Angstroms in this embodiment) as shown in FIG. 6.

A final oxide, nitride or a similar passivation layer 38 is deposited thereon. Vias are opened to the tungsten first metal, and a second layer 39 of Ti or Ti/W and gold or aluminum is deposited by evaporation or sputtering methods (as appropriate) and patterned to complete the structure shown in FIG. 6. A second passivation layer (not shown) is commonly used in addition, to protect metal integrity.

FIGS. 7-10 are section views illustrating another embodiment of the invention in the fabrication of a silicon gate DMOS transistor device. First, shown in FIG. 7, p+ wells 41 are implanted and/or diffused into n-type epitaxial silicon 40 that has been covered by silicon 42 nitride where appropriate windows for dopant insertion have been cut. A layer of silicon oxide 43 is regrown in the opening in the process.

Figure 8:
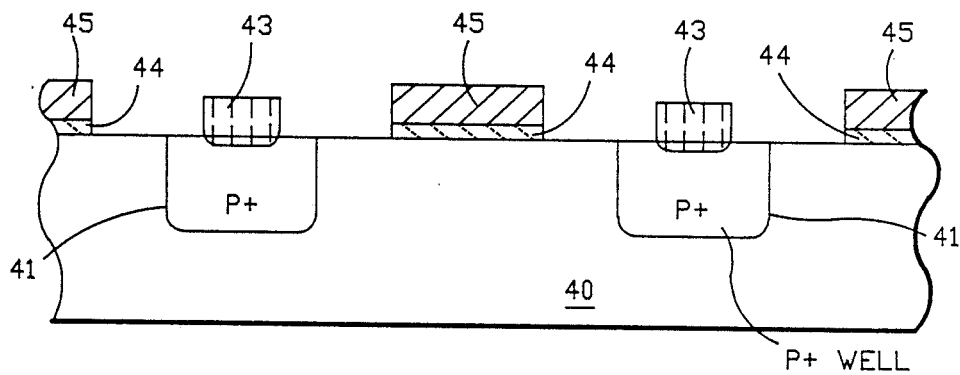

Next, after a nitride etch process, a gate oxide 44 is grown on the silicon surface and a layer of polysilicon 45 is deposited on the oxide surface. Windows are opened in the oxide and polysilicon, leaving a pattern of these two layers which will form the gate region as shown in FIG. 8.

Figure 9:
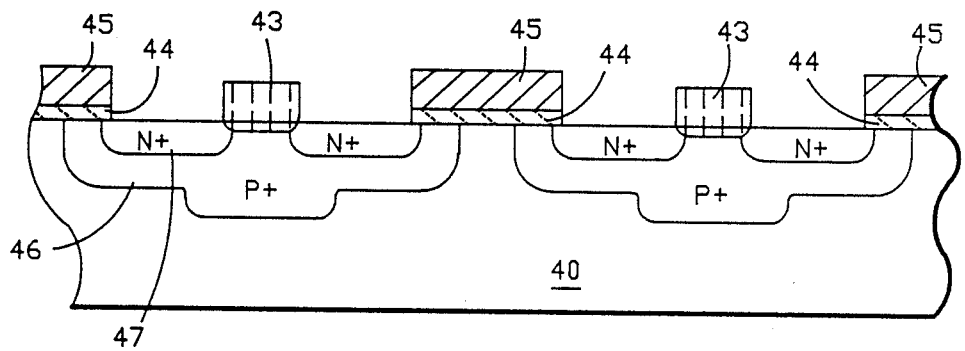
Figure 10:
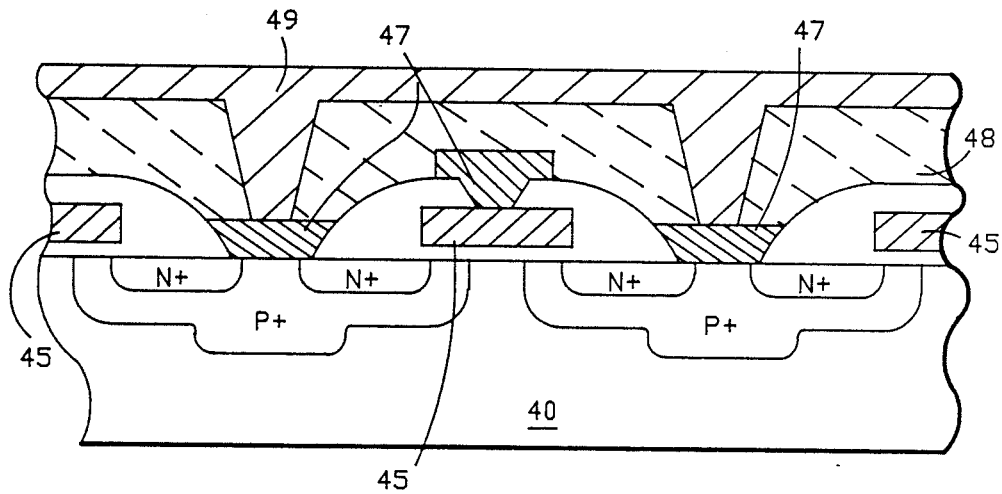

Thereafter, as shown in FIG. 9, p-region 46 and n+ region 47 are formed by dopants diffused or implanted through the windows to form the channel and the source. The relative depth of these regions and the distance that they penetrate under the gate oxide determine the length of the channel. The gate and channel are therefore self-aligned by this double diffusion process.

Subsequently, oxide is removed from the p+ regions, a layer of oxide or nitride passivation is deposited and gate and source contacts are patterned and etched through the oxide to the silicon surface, and a thin layer of tungsten 47 is deposited by the self-aligned CVD processes described above. The surface is then covered with glass, silicon nitride or a similar passivating material 48. Vias are opened through this layer and Ti/W and gold or aluminum metal 49 is deposited by evaporation or sputtering processes to complete the second layer of the metal structure as illustrated in the completed device in FIG. 10. The upper surface of the die obviously contains such other essential and conventional device features as field termination rings, and bonding pads.

Figure 11:
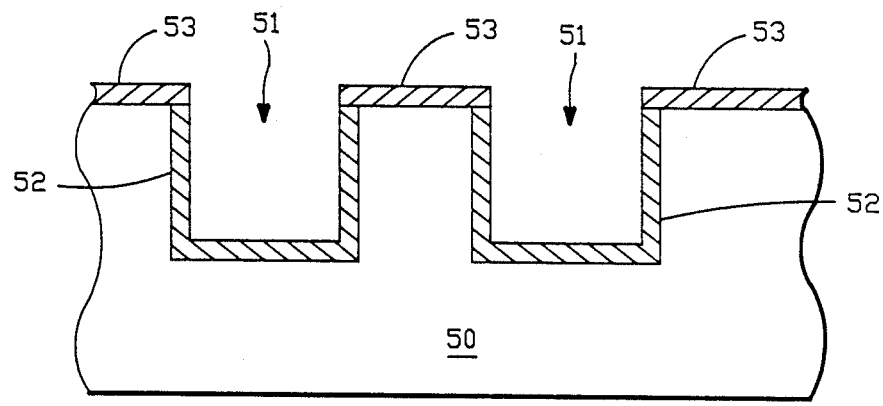
FIGS. 11–13 are section views illustrating the fabricating of a field effect transistor in a trenched surface of a semiconductor substrate in accordance with another embodiment of the invention.
Figure 12:
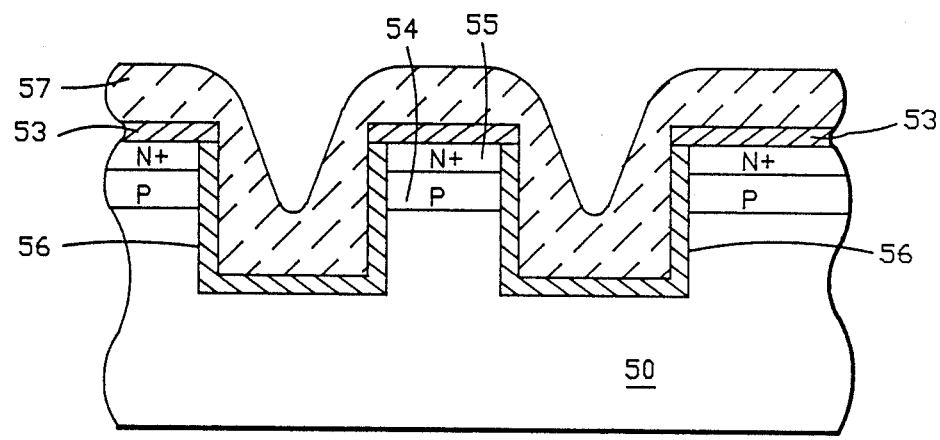
Figure 13:
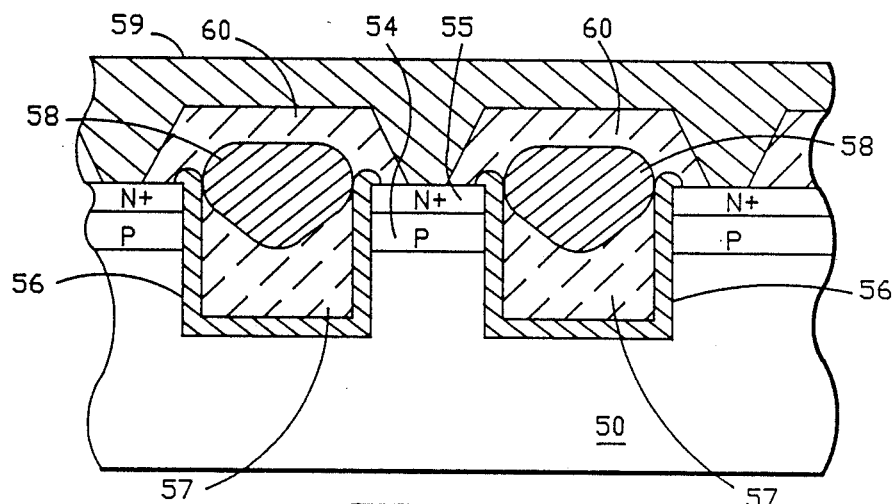

FIGS. 11-13 are section views illustrating the fabrication of field-effect transistor devices in a trenched surface of a substrate in accordance with another embodiment of the invention. In FIG. 11, approximately 1.5 to 2.0 micron deep, 0.8 to 2.0 microns wide trenches are etched in the silicon substrate 50 through openings in silicon nitride layer 53, and in the trenched surface is then grown an oxide layer 52 ($\sim$5000Å) as shown in FIG. 11.

Subsequently, after the silicon nitride layer is etched by a preferential etch such as hot phosphoric acid followed by a short oxide etch to clear the substrate surface, p$^-$ channel (boron) 54 and n+ source (arsenic or phosphorus) 55 diffusions or implants are performed (followed by an activation diffusion). Oxide is regrown in the process. Afterwards, all oxide is etched back from the trench and the surface of the device and the gate oxide 56 is grown. Subsequently, about 5,000Å of polysilicon 57 is deposited as shown in FIG. 12. A phosphorus diffusion is performed after polysilicon deposition to reduce its resistivity. After gate pattern delineation and etch of the polysilicon layer only, tungsten metal 58 is selectively deposited (CVD process) on the gate/polysilicon to a thickness of about 4,000Å.

The FET source contact is then opened as illustrated in FIG. 13. Via oxide 60 is deposited to a thickness of approximately 8,000Å and patterned. Subsequently, platinum is deposited and sintered. This does not affect the tungsten layer on the gate; however, it does form a low ohmic contact on the source contact opening. Titanium-tungsten, and gold (or aluminum) is then deposited and patterned as shown at 59 in FIG. 13. The device is finished by a surface protective coating of deposited oxide or nitride or other suitable passivation element (not shown).

A method of forming self-aligned first metal in a dual-metallization process and applications thereof have been described. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

We claim:

1. A method for fabricating a high power RF bipolar integrated circuit having closely spaced emitter sites by utilizing dual-metallization comprising the steps of:
    providing a silicon substrate of one conductivity type and having a major surface with a first dielectric layer on said major surface, forming a guard-ring of opposite conductivity type in said major surface and defining a transistor region therein, forming a base region of said opposite conductivity type in said major surface and within said transistor region, forming an emitter region of said one conductivity type in said major surface and within said base region, reforming said first dielectric layer on said major surface over said base region and over said emitter region, forming openings through said first dielectric layer thereby exposing selected silicon surface areas of said major surface of said substrate, depositing a first tungsten conductive layer on said selected surface areas in a heated environment whereby said tungsten forms low-resistivity ohmic contacts on said selected silicon surface areas, forming a second dielectric layer over said major surface and said deposited tungsten, forming openings through said second dielectric layer to said low-resistivity ohmic contacts, depositing a second conductive layer on said second dielectric layer and in said openings to said low-resistivity ohmic contacts, and selectively removing said second conductive layer from said second dielectric layer to form a metal layer interconnect.

2. The method as defined in claim 1 wherein said step of depositing tungsten in a heated environment includes first depositing tungsten at a first temperature and then depositing tungsten at a second temperature higher than said first temperature.

3. The method as defined in claim 2 wherein said first temperature is in the range of 250° C. to 350° C. and said second temperature is on the order of 450°-650° C.

4. The method as defined by claim 1 wherein said first and second dielectric layers are silicon oxide.

5. The method as defined by claim 1 wherein said conductive layer is selected from the group consisting of titanium, titanium-tungsten, gold, and aluminum.

6. The method as defined by claim 1 wherein said conductive layer is a metal.

7. The method as defined by claim 1 wherein said conductive layer is doped polysilicon followed by another conductive metal layer connected to the doped polysilicon.

8. The method as defined by claim 1 wherein the step of depositing tungsten includes a chemical vapor deposition in a heated environment using tungsten hexafluoride and hydrogen as reactant gases.

* * * * *